United States Patent [19]

Hill et al.

[11] Patent Number: 4,759,836
[45] Date of Patent: Jul. 26, 1988

[54] ION IMPLANTATION OF THIN FILM $CRSI_2$ AND SIC RESISTORS

[75] Inventors: Lorimer K. Hill, Cupertino; Barry L. Chin, Sunnyvale; Richard A. Blanchard, Los Altos, all of Calif.

[73] Assignee: Siliconix Incorporated, Santa Clara, Calif.

[21] Appl. No.: 84,541

[22] Filed: Aug. 12, 1987

[51] Int. Cl.$^4$ .................. B05D 5/12; B05D 3/06; H01C 17/06

[52] U.S. Cl. ................ 204/192.21; 427/38; 427/101; 427/102; 427/103; 29/620; 437/918

[58] Field of Search ............. 427/38, 101, 102, 103; 437/28; 29/610 R, 620; 204/192.21; 437/918

[56] References Cited

U.S. PATENT DOCUMENTS

| | | | |
|---|---|---|---|
| 4,021,277 | 5/1977 | Shirn et al. | 156/657 |
| 4,196,228 | 4/1980 | Priel et al. | 427/38 |
| 4,225,877 | 9/1980 | Miles et al. | 357/41 |
| 4,510,178 | 4/1985 | Paulson et al. | 427/103 |
| 4,520,342 | 5/1985 | Vugts | 427/102 |
| 4,597,163 | 7/1986 | Tsang | 427/38 |
| 4,682,143 | 7/1987 | Chu et al. | 427/102 |

*Primary Examiner*—Norman Morgenstern
*Assistant Examiner*—Margaret Burke
*Attorney, Agent, or Firm*—Alan H. MacPherson; Paul J. Winters; Brian D. Ogonowsky

[57] ABSTRACT

A thin film resistor is formed using sputtering to deposit a thin film of resistive material on an insulating surface. The sputter target is composed of constituents which are normally present in relatively large quantities in thin film resistors, such as chromium silicide and silicon carbide. The sputtered thin film material is formed into resistor regions. An insulating layer is deposited over the thin film material. Ions (e.g., boron ions) are then implanted into the thin film through the insulating layer. These implanted constituents have a significant effect on the temperature coefficient and sheet resistance of the thin film resistor. Ion implantation of these constituents enables more control over the characteristics of the thin film resistor as compared to prior art techniques not using ion implantation.

7 Claims, 1 Drawing Sheet

ION IMPLANTATION OF THIN FILM CRSI$_2$ AND SIC RESISTORS

BACKGROUND OF THE INVENTION

1. Field of the Invention

This invention relates to thin film electrical resistors used in integrated circuits, and specifically to a method for producing thin film resistors with selectable temperature coefficients and improved resistance value tolerances.

2. Description of the Prior Art

Electrical resistors are formed by high resistivity material connected between two electrodes. The resistor's resistance is equal to its length divided by its cross-sectional area, times a constant for the material. Because resistance is inversely proportional to cross-sectional area, small cross-section resistors are useful in high density, low power integrated circuits for providing high resistances in short lengths.

High resistivity resistors may be formed in a semiconductor substrate of a given conductivity type (N-type or P-type) and a given resistivity by forming a region in and on the surface of the semiconductor substrate with a predeposition step, this region being of a conductivity type opposite that of the substrate, and then diffusing the impurities introduced during the predeposition to a desired depth. By carefully controlling the amount of dopant introduced during the predeposition, a high sheet resistance resistor may be formed.

The introduction of impurities by thermal predeposition techniques does not allow the control in resistor value that is often required for circuit applications. The "doped" resistors also have a temperature coefficient of resistance (TCR) that is set by the relative dopant concentration in the resistor and cannot be set to provide desirable circuit operating characteristics. Diffused resistors are also not trimmable using laser techniques.

Resistors are also formed by implanting ions into an exposed region (i.e., not covered by an SiO$_2$ layer) to form a high resistivity region in the substrate instead of using diffusion as described above, but while implantation allows better control of the resistance value, the TCR and trimmability of these resistors are the same as those of the resistors formed by thermal predeposition.

U.S. Pat. No. 4,196,228 to Priel et al. forms a resistor in a substrate by implanting boron ions through a 3,000–4,000 angstrom thick layer of SiO$_2$ to a depth of "about 0.1 microns, which will diffuse into the semiconductor substrate to no more than 0.5 microns during the remaining heating steps in the fabrication process" (See Priel et al., U.S. Pat. No. 4,196,228, Col. 4, lines 58–61, and Col. 5, lines 37–42). Resistor values produced by this method are also fairly difficult to control due to the need for precise implantation depth and the inability to precisely control final depth after heating. In addition, the TCR and trimmability characteristics are close to those resistors formed by implanting into the bare semiconductor.

Besides having resistance values which are difficult to control, resistors formed in the substrate need reverse biasing to electrically isolate them from the substrate or from other circuit elements in the substrate.

Alternatively, resistors are made from thin films, such as doped polysilicon several hundred to several thousand angstroms thick, formed by chemical vapor deposition over a layer of insulation on the surface of a substrate. Thin film resistors can be made to have high sheet resistance values; may be located anywhere on the surface of an integrated circuit; are electrically isolated from other circuit elements without biasing; and may be laser-trimmed for closer resistance value tolerances. However, high yields of these doped polysilicon resistors using chemical vapor deposition are limited to resistance tolerances of approximately ±40% (See Miles et al., U.S. Pat. No. 4,225,877, Col. 1, lines 16–20). U.S. Pat. No. 4,225,877 to Miles et al. describes a polysilicon film resistor which is doped by ion bombardment to achieve high yield tolerances of ±15%.

> A polysilicon layer is . . . formed over the silicon oxide covering the entire wafer surface by a standard low pressure chemical vapor deposition step. . . A polycrystalline layer is produced having a thickness of about 4000 angstroms. Boron ions are then implanted into the surface of the polysilicon, using a boron dopant such as boron or BF$_2$ at 150 KeV . . .
> Then, by a standard photoresist and etching step, the polysilicon is selectively removed to define the lateral extent of the resistors, all of which are about 10 microns wide but of various particular lengths to determine the final resistance values (Miles et al., Col. 5, lines 32–56).
> The ion implanted polysilicon resistors can be made with high yields to resistance tolerance specifications of as little as ±25[%] (Miles et al., Col. 1, lines 63–65). [By annealing the polysilicon resistor in an inert atmosphere] the resistors can be made with high yield to an even smaller tolerance such as ±15% (Miles et al., Col. 2, lines 48–49).

It is important to note that neither polycrystalline nor single crystal silicon resistors can be made to have a temperature coefficient that is nominally zero by implantation of any amount of boron, phosphorus, arsenic, antimony or other common dopants. The temperature coefficient of such a 2 KΩ/square resistor can be expected to be on the order of ±7000 ppm/°C.

Thin film resistors are also made by the well-known technique of sputtering, described in U.S. Pat. No. 4,021,277 to Shirn et al. Sputtering thin film resistors entails using energetic particles, usually positive argon ions, to bombard a target composed of resistor constituents in the desired ratios, causing atoms to be energized and ejected from the target surface. A common source of these high energy ions for sputtering is provided by the well-known phenomenon of glow discharge resulting from an applied electric field between two electrodes in a gas, such as argon, at low pressures. Another common source of ions for sputtering is the ionization of a low pressure gas by exposure to a high intensity radio frequency (r.f.) electromagnetic field, which may be accomplished by the application of an r.f. voltage to electrodes, or r.f. current through a coil, in the vacuum chamber. Many practical variations of this method of ion production are employed. The rate of deposition of atoms on a substrate by sputtering is generally more readily controlled than by evaporation. (Evaporation is accomplished by heating the substance to be deposited to the point of evaporation and allowing the evaporated substance to condense into a thin film.) A sputtered film is also generally more uniform. Atoms sputtered from the target material condense to form a thin film on surfaces positioned near the target surface. To form thin film resistors, resistor material is sputtered onto an insulating layer over a substrate surface.

Common target constituents typically include a mixture of chromium silicide ($CrSi_2$) and silicon carbide (SiC), which, after sputtering, constitute the bulk of the thin film resistor in approximately the same ratio as in the target. Other constituents in the target, such as carbon and boron, may be a small fraction of the target mass but have a significant effect on the temperature coefficient and sheet resistance of the resistor. These constituents, however, due to their low quantities in the target, may not get uniformly distributed in the thin film resistor and are usually not condensed in the same ratio as in the target. What is needed is a thin film resistor which can be sputter-deposited and which can be produced with high yields to small tolerances and with low temperature coefficients.

SUMMARY

Thin film resistors are formed according to the preferred embodiment of this invention by sputter-depositing the resistor bulk constituents, for example chromium silicide ($CrSi_2$) and silicon carbide (SiC), to create a resistive thin film layer of approximately 100-150 angstroms in thickness; next, covering the resistive thin film with a layer of insulation such as silicon dioxide; and, ion implanting additional constituents, for example carbon and boron, into the thin resistive film at various energy levels in order to achieve a high degree of control over the concentration of these constituents. Supplementary Cr, Si, and C can also be implanted if their ratios need to be adjusted.

Forming a layer of insulation before the ion implantation step prevents the ions from passing completely through the thin film and, thus, avoids leaving an unchanged profile or concentration in the thin film. The insulation layer enables the peak concentration of ions to embed in the resistive thin film and later protects the thin film during the interconnect metal etch step. Multiple implants at different energy levels produce overlapping distributions, which ensure that production variations in insulator layer thickness do not cause implanted ions to miss the zone of the resistive thin film. By choosing the proper implant constituents and by controlling ion energy levels, dosages, and implantation time, highly selective control over the resistance and temperature coefficient of the thin film resistor is obtainable.

DETAILED DESCRIPTION

Figure 1:
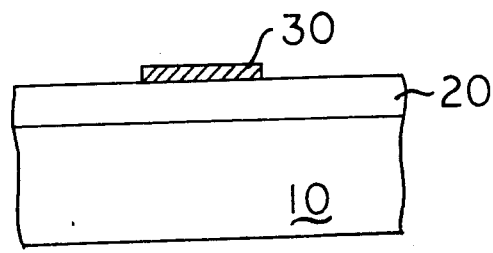
FIG. 1 is a cross-sectional view of a substrate with an insulating layer overlying the substrate and a resistive thin film sputtered-deposited and etched.

In accordance with one embodiment of this invention, a substrate 10, shown in FIG. 1, such as silicon, has a layer of silicon dioxide (oxide) 20 or other insulating material either thermally grown on or deposited on its surface using well-known techniques. The thickness of insulating layer 20 must be sufficient to prevent an objectionable number of ions from passing through into substrate 10 during a subsequent ion implantation step. Where is it objectionable to have ions introduced into the underlying substrate, a thickness of approximately 2000 angstroms is sufficient for ion energy levels used in the preferred embodiment of the present invention. (See Modern Semiconductor Fabrication Technology, by Peter Gise and Richard Blanchard (Prentice Hall, 1986), p. 99, for more detail on mask thickness for ion implantation).

A composition of resistor material 30, such as chromium silicide ($CrSi_2$) and silicon carbide (SiC), is sputtered onto the surface of oxide layer 20. The resulting thin film material is composed of the material present in large quantities in the resistor. In the preferred embodiment of the invention, the sputtered resistor material is composed of 75% $CrSi_2$ and 25% SiC and is on the order of 100-150 angstroms in thicknesses. This composition and thickness will produce a thin film of resistor material with approximately $2000\Omega$/square sheet resistance and $-300$ ppm/°C. temperature coefficient of resistance. To deposit a 100-150 angstrom thick layer of resistor material 30 in this ratio, a target material composed of 75% $CrSi_2$ and 25% SiC is bombarded, in a low pressure chamber, with argon ions using a DC triode sputtering system. Other techniques for depositing the resistor material, such as vacuum deposition or evaporation, will be obvious to those skilled in the art.

The layer of resistive material 30 is then selectively etched using dry etching, such as reactive ion etching, so as to leave a section of resistive material 30 with the desired physical dimensions.

Figure 2:
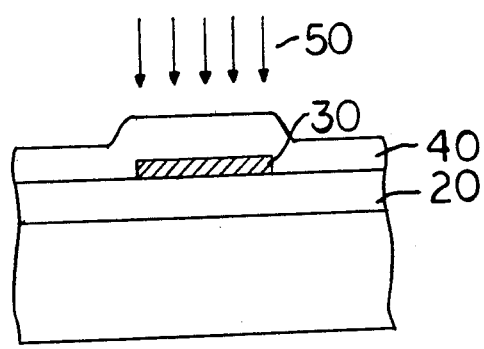
FIG. 2 is the structure of FIG. 1 with an insulating layer deposited over the upper surface of the wafer and ions being implanted into the resistive thin film.

Shown in FIG. 2, insulating layer 40, such as silicon dioxide, is formed over the upper surface of the wafer. In the preferred embodiment this layer is low temperature oxide, 2000 angstroms thick. Insulating layer 40 serves two purposes: the first is that insulating layer 40 protects the resistor during the subsequent etching of interconnect metal; the second is that it allows the use of energy levels, for the subsequent implantation of ions, which are readily available on present day equipment.

Next, ions 50 are implanted into resistor material 30 to enable precise doping levels in resistor material 30. These doping levels may be adjusted to precisely control the temperature coefficient and sheet resistance of resistor material 30. Boron, for example, is added to decrease the magnitude of the temperature coefficient and reduce resistance. In the preferred embodiment, $1 \times 10^{16}/cm^2$ ions of boron are implanted at three energy levels: 50 KeV, 65 KeV, and 80 KeV, in order to obtain three different mean depths of the dopant. These multiple implants produce overlapping distributions which ensure that a relatively consistent number of ions embed in resistor material 30 despite production variations in insulator thickness. Insulating layers 20 and 40 together prevent an objectionable number of ions from embedding into substrate 10. Ion implantation of Cr, Si, and C may also be used to adjust the ratios of these elements in the thin film resistor.

Figure 3:
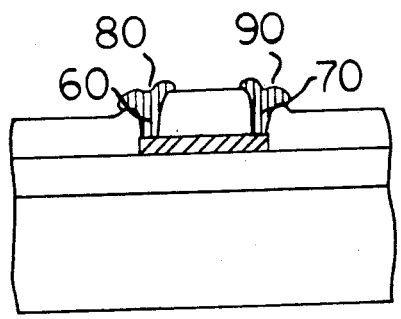
FIG. 3 is the structure of FIG. 2 with electrical contact holes formed and metal electrodes electrically contacting the resulting thin film resistor.

A photoresist layer (not shown) is formed, and insulating layer 40 is etched, to reveal two contact areas 60, 70, shown in FIG. 3, located at each end of resistor material 30. The photoresist layer is removed and a conducting layer is formed to provide electrical contacts 80, 90, to resistor material 30.

In the preferred embodiment of this invention as described above, a 48% reduction in temperature coefficient of resistance (TCR) ($\Delta$ resistance($\Omega$)/initial resistance($\Omega$)/$\Delta$ temperature (°C.)) was obtained by implanting the boron at the above-described energy levels and conditions, while the sheet resistance of the thin film resistor was concomitantly reduced by 16%. Using a longer implantation time for the boron, or higher dosages and beam currents, would further reduce the TCR of the resistor.

The above process describes a new technique which has been shown to more accurately control the temperature coefficient and sheet resistance of thin film resistors. Using different implantation conditions and different ions, such as carbon, will produce various changes in the temperature coefficient and sheet resistance of the thin film resistor. It will be obvious to those skilled in the art to try various combinations known to bring about certain changes in temperature coefficient and sheet resistance to achieve the desired resistor characteristics.

This description is by no means intended to be restricted to the preferred embodiment of this invention. Various modifications to the invented process described may be made by those skilled in the art without departing from the spirit and scope of the invention.

We claim:

1. A method for forming a thin film resistor on an insulating surface comprising the steps of:
   depositing a thin film resistor of a material selected from the group consisting of chromium silicide ($CrSi_2$), silicon carbide (SiC), and mixtures thereof over said insulating surface where said thin film resistor is desired;
   forming an insulating layer over said thin film resistor; and
   implanting ions selected from the group consisting of carbon and boron ions into said thin film through said insulating layer to adjust the temperature coefficient of said thin film.

2. A method as in claim 1 wherein the step of implanting ions is also used to adjust the sheet resistance of said thin film.

3. A method as in claim 2 wherein the step of depositing a thin film comprises:
   providing a sputter target of a material selected from the group consisting of $CrSi_2$, SiC, and mixtures thereof; and
   sputtering said target to deposit a thin film on said insulating surface where said thin film resistor is desired.

4. A method as in claim 3 wherein the step of providing a sputter target is further characterized in that said target material is a mixture of $CrSi_2$ and SiC in substantially the same proportions as their desired proportions to each other in said thin film.

5. A method as in claim 4 wherein said sputter target comprises approximately 75% $CrSi_2$ and 25% SiC.

6. A method as in claim 4 further comprising the step of implanting ions to adjust the ratio of sputtered material in said thin film.

7. A method as in claim 4 further characterized in that said step of implanting ions is repeated using a range of implantation energy levels to produce overlapping ion distributions to ensure that said ions are implanted within said thin film despite production variations in insulation thickness.

* * * * *